(12) United States Patent
Tan et al.

(10) Patent No.: US 10,753,569 B2
(45) Date of Patent: Aug. 25, 2020

(54) LIGHTING STRIP AND LIGHTING DEVICE

(71) Applicant: Lumileds LLC, San Jose, CA (US)

(72) Inventors: Coon Chow Tan, Kuala Lumpur (MY); Su Ping Tan, Bayan Baru (MY); Tomonari Ishikawa, Saitama (JP); Selvakumar Palaniandy, Penang (MY)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/415,511

(22) Filed: May 17, 2019

(65) Prior Publication Data

US 2019/0338909 A1 Nov. 7, 2019

Related U.S. Application Data

(63) Continuation of application No. 15/735,143, filed as application No. PCT/EP2016/062520 on Jun. 2, 2016, now Pat. No. 10,295,141.

(30) Foreign Application Priority Data

Jun. 8, 2015 (CN) ..................... 2015 2 0393430 U

(51) Int. Cl.
*F21V 21/00* (2006.01)
*F21S 43/19* (2018.01)
*H05K 1/18* (2006.01)
*F21S 4/24* (2016.01)
*F21S 43/14* (2018.01)
*F21S 43/236* (2018.01)
*B60Q 1/00* (2006.01)

(Continued)

(52) U.S. Cl.
CPC .......... *F21S 43/195* (2018.01); *B60Q 1/0088* (2013.01); *F21S 4/24* (2016.01); *F21S 43/14* (2018.01); *F21S 43/236* (2018.01); *H05K 1/189* (2013.01); *B60Q 1/30* (2013.01); *B60Q 1/44* (2013.01); *F21Y 2107/70* (2016.08); *F21Y 2115/10* (2016.08); *H05K 1/0283* (2013.01); *H05K 2201/10106* (2013.01)

(58) Field of Classification Search
CPC ....... F21S 43/195; F21S 4/24; F21Y 2107/70; H05K 1/189; H05K 1/0283
USPC ..................................................... 362/249.02
See application file for complete search history.

(56) References Cited

U.S. PATENT DOCUMENTS 8,466,619 B2  6/2013  Lee et al.
8,657,468 B2  2/2014  Im et al.
(Continued)

FOREIGN PATENT DOCUMENTS

CN   202561541       11/2012
CN   103175084 A      6/2013
JP   2013-134857 A    7/2013

*Primary Examiner* — Laura K Tso
(74) *Attorney, Agent, or Firm* — Volpe and Koenig, P.C.

(57) ABSTRACT

A lighting strip comprises a flexible printed circuit strip. The flexible printed circuit strip comprises a plurality of wiring portions and a plurality of carrying portions. The plurality of wiring portions are configured to supply electrical power to the plurality of carrying portions. The lighting strip comprises a plurality of solid-state lighting elements respectively disposed on the plurality of carrying portions. The plurality of wiring portions include at least one pitch adjusting portion configured to adjust a pitch between two adjacent carrying portions and to enable the flexible printed circuit strip to be arranged in a three-dimensional shape.

17 Claims, 2 Drawing Sheets

(51) Int. Cl.
*H05K 1/02* (2006.01)
*F21Y 115/10* (2016.01)
*F21Y 107/70* (2016.01)
*B60Q 1/30* (2006.01)
*B60Q 1/44* (2006.01)

(56) References Cited

U.S. PATENT DOCUMENTS

| | | | |
|---|---|---|---|
| 9,113,558 | B2 | 8/2015 | Baik |
| 10,295,141 | B2 * | 5/2019 | Tan .................. H05K 1/189 |
| 2009/0103295 | A1 | 4/2009 | Wang |
| 2012/0033426 | A1 | 2/2012 | Wendt |
| 2014/0001498 | A1 | 1/2014 | Cooijmans |
| 2014/0247595 | A1 | 9/2014 | Lind et al. |
| 2015/0003083 | A1 | 1/2015 | Uehara |

\* cited by examiner

LIGHTING STRIP AND LIGHTING DEVICE

CROSS REFERENCE TO RELATED APPLICATIONS

This application is a continuation of U.S. patent application Ser. No. 15/735,143, filed Dec. 8, 2017, which is the U.S. National Stage, under 35 U.S.C. § 371, of International Application No. PCT/EP2016/062520, filed Jun. 2, 2016, which claims the benefit of Chinese Application No. 201520393430.4, filed Jun. 8, 2015, now Chinese Patent No. ZL2015203934304, issued on Feb. 24, 2016, the contents of which are hereby incorporated by reference herein.

FIELD OF THE DISCLOSURE

Embodiments of the present disclosure relate to a lighting strip, and more specifically to a lighting strip adapted to be bent horizontally or vertically to implement various three dimensional illumination.

BACKGROUND OF THE DISCLOSURE

Styling lighting is widely used in the industrial field, for example, used in a tail lamp, a brake lamp, combination lamp for an automobile, and a display panel for a display. Such lighting devices usually comprise a light-emitting element and a light guide, wherein light emitted from the light-emitting element transmits through the light guide and exits out of the light guide, thereby forming various light shape patterns. However, to meet requirements for pleasant appearance, or requirements for specific light shapes, the light guide usually takes various three-dimensional shapes, e.g., the light guide has a different curvature. How to position the light-emitting element properly with respect to the light guide to achieve uniform illumination is a technical problem urgently to be solved in the art.

SUMMARY OF THE DISCLOSURE

In view of the above, one of the objectives of the embodiments of the present disclosure lies in providing a lighting strip and a lighting device, which can at least solve one or more of aforesaid technical problems existing in the prior art.

According to a first aspect of the present disclosure, there is provided a lighting strip, comprising a flexible printed circuit strip which comprises a plurality of wiring portions and a plurality of respective carrying portions, wherein the wiring portions are used to supply electrical power to electric elements disposed on the carrying portions, and the carrying portions protrude from the wiring portions and are adapted to be bent around the wiring portions; a plurality of solid-state lighting elements respectively mounted on the carrying portions; wherein the wiring portion is provided with at least one pitch adjusting portion for adjusting a pitch between two adjacent carrying portions.

According to one embodiment of the present disclosure, at least one wiring portion of the plurality of wiring portions comprises a main body portion and at least one flexible arm extending protrudingly from the main body portion, and the pitch adjusting portion is comprised of at least one flexible arm.

According to one embodiment of the present disclosure, the flexible arm is disposed between two adjacent wiring portions, and the flexible arm is formed in a shape having an opening.

According to one embodiment of the present disclosure, opening direction of the opening is identical with or opposite to a direction in which the carrying portion protrudes from the wiring portion.

According to one embodiment of the present disclosure, the flexible arm is U-shaped or V-shaped.

According to one embodiment of the present disclosure, the flexible arm is configured such that its arm portion can be folded in a horizontal or vertical surface to change opening degree of the opening and thus to adjust the pitch between two adjacent carrying portions and/or a light transmitting direction of the solid-state lighting elements mounted on the two adjacent carrying portions.

According to one embodiment of the present disclosure, the main body portion is provided with a welding pad for line connection and/or a contact for an individual connector.

According to one embodiment of the present disclosure, the solid-state lighting element is a light-emitting diode.

According to a second aspect of the present disclosure, there is provided a lighting device, comprising a light guide member having a light incident surface and a light exit surface; and the lighting strip according to the first aspect; wherein the carrying portion of the lighting strip is arranged substantially opposite to the light incident surface so that light from the solid-state lighting element mounted on the carrying portion transmits through the light incident surface into the light guide member, and the pitch between two adjacent carrying portions of the lighting strip can be adjusted via the pitch adjusting portion.

According to one embodiment of the present disclosure, the lighting device is used as a lamp for use in a vehicle.

According to the lighting strip and lighting device of embodiments of the present disclosure, with arranged the pitch adjusting portion, the positions of the solid-state lighting elements on the carrying portions, particularly the positions relative to the lighting elements, can be conveniently and precisely adjusted, thereby achieving a desired three-dimensional styling illumination.

BRIEF DESCRIPTION OF THE ACCOMPANYING DRAWINGS

Now, the embodiments of the present disclosure will be described with reference to the accompanying drawings only in an exemplary manner, wherein.

DETAILED DESCRIPTION OF THE PREFERRED EMBODIMENTS

Figure 1:
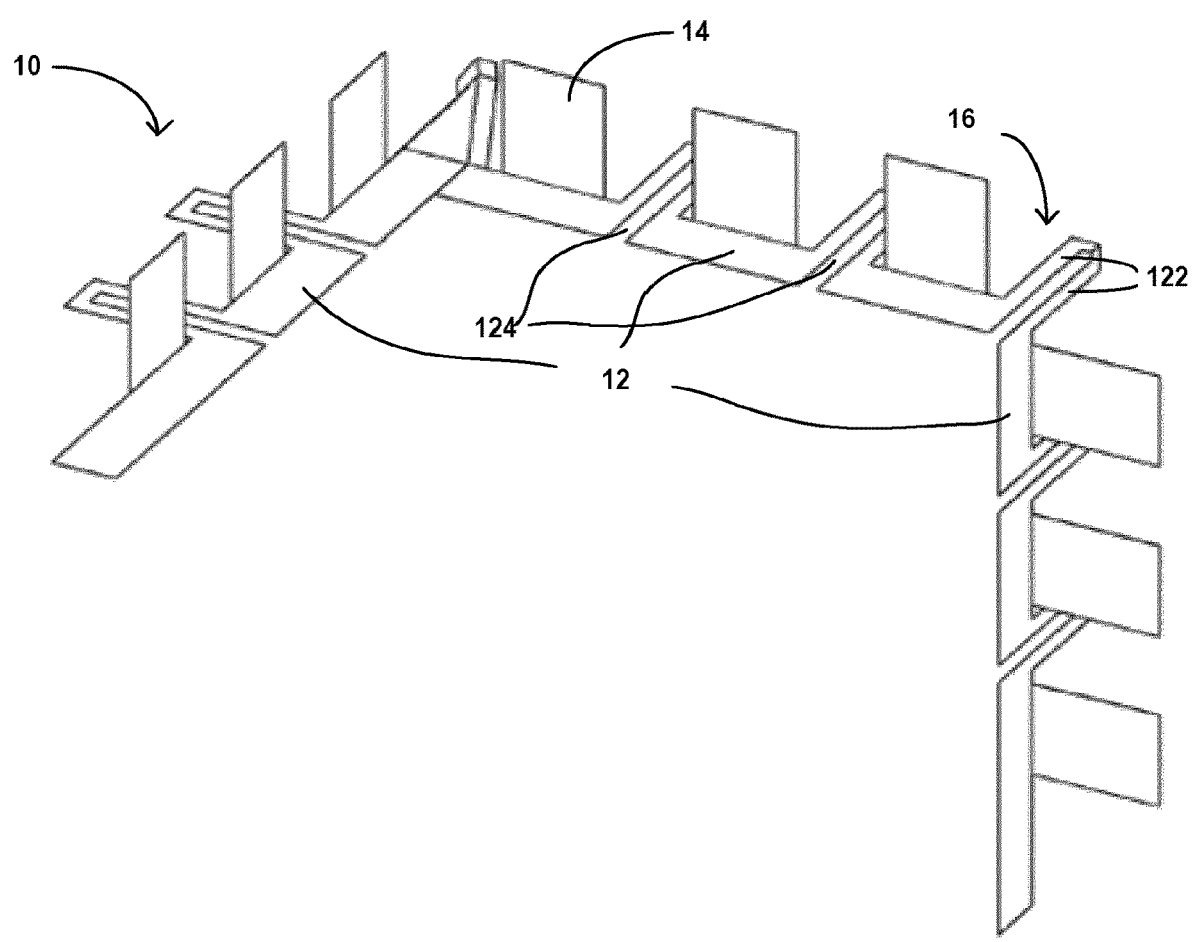
FIG. 1 shows a structural schematic view of a flexible printed circuit strip according to one embodiment of the present disclosure.

Hereinafter, the embodiments of the present disclosure will be described in detail with reference to figures. It should be noted that like reference numerals may be used for like components or functional assemblies in the figures. The figures are only intended to illustrate the embodiments of the present disclosure. Those skilled in the art may obtain an alternative embodiment from the description below without departing from the spirit and protection scope of the present disclosure.

The embodiments of the present disclosure will be described in detail with reference to figures.

Figure 2:
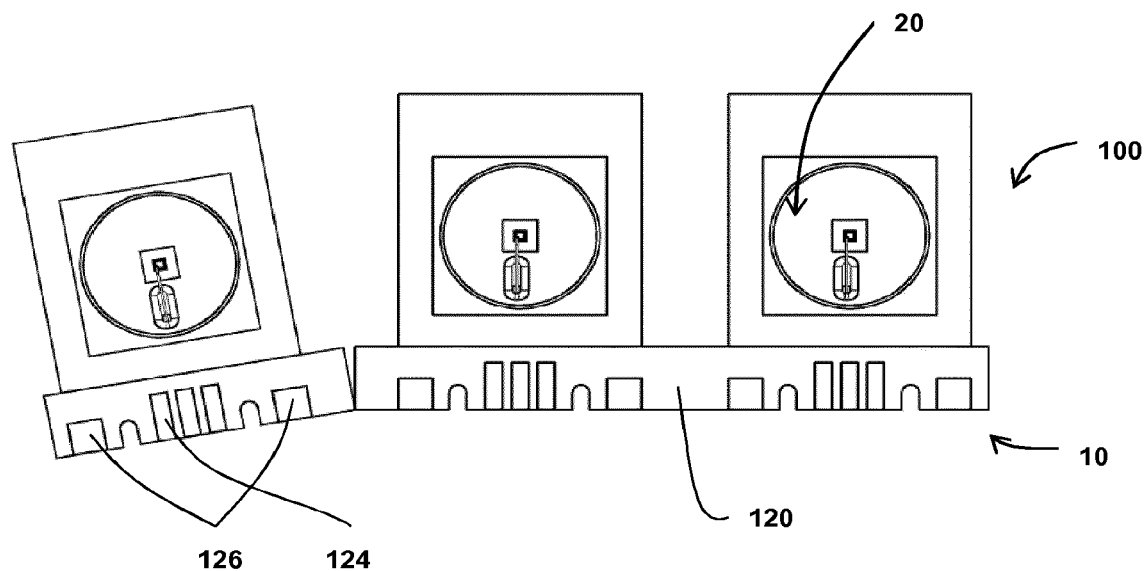
FIG. 2 shows a structural schematic view of a lighting strip according to one embodiment of the present disclosure.

FIG. 1 shows a structural schematic view of a flexible printed circuit strip 10 according to one embodiment of the present disclosure; FIG. 2 shows a structural schematic view of a lighting strip 100 according to one embodiment of the present disclosure. As shown in FIG. 1 and FIG. 2, the lighting strip 100 according to one embodiment of the present disclosure comprises a flexible printed circuit strip 10 and a solid-state lighting element 20.

The flexible printed circuit strip 10 comprises a plurality of wiring portions 12 and a plurality of respective carrying portions 14. The wiring portions 12 are used to supply electrical power to electric elements disposed on the carrying portions 14, and the carrying portions 14 protrude from the wiring portions 12 and are adapted to be bent around the wiring portions 12. In an embodiment, the carrying portions 14 protrude from the wiring portions 12 in a tooth shape, e.g., in a rectangular tooth shape as shown in FIG. 1. It should be appreciated that according to needs, the carrying portions 14 may protrude from the wiring portions 12 in other various proper shapes so long as the carrying portions 14 can carry the electric elements or lighting elements.

The wiring portions 12 and carrying portions 14 may be made from the same material, e.g., a flexible polymer such as polyimide, polyester, ether ketone and polyether. As shown in FIG. 1, the carrying portions 14 are adapted to be bent around a boundary between the carrying portions 14 and wiring portions 12. Although FIG. 1 shows that the carrying portions 14 all are bent from the respective wiring portions 12, it should be appreciated that the carrying portions 14 may be selectively bent according to needs. As shown in FIG. 2, a plurality of solid-state lighting elements are respectively mounted on the carrying portions 14. The solid-state lighting elements 20 for example may be LEDs. In some embodiments, the wiring portions 12 and carrying portions 14 may be made from different materials, for example, the wiring portions may be made from an electrically conductive material.

An important characteristic of the embodiment of the present disclosure lies in that the wiring portion 12 is provided with a pitch adjusting portion 16 for adjusting a pitch between two adjacent carrying portions 14. As the carrying portion 14 is adapted to be bent around a boundary between the carrying portion 14 and wiring portion 12, a mounting flexibility of the carrying portion 14 can be increased. In the case that the pitch adjusting portion 16 is arranged, the mounting flexibility of the carrying portion 14 can be further enhanced. Specifically, in the case that the pitch adjusting portion 16 is not arranged, relative positions of two adjacent carrying portions 14 can only be changed by bending to implement position adjustment, so adjustment amplitude is limited. For example, it is difficult to accurately position the carrying portion with respect to the light guide member for a complicated curved shaped light guide structure. With the pitch adjusting portion 16 being arranged, the relative positions of the two adjacent carrying portions 14 may be freely adjusted by the pitch adjusting portion 16, so that the lighting element 20 can be precisely positioned and thereby an incident angle at which the solid-state lighting element 20 enters the light guide member can be precisely adjusted.

According to one embodiment of the present disclosure, at least one wiring portion 12 of the plurality of wiring portions 12 comprises a main body portion 120 and at least one flexible arm 122 extending protrudingly from the main body portion 120, and the pitch adjusting portion 16 is comprised of at least one flexible arm 122. In such an arrangement, the pitch adjustment between wiring portions 12 can be easily implemented through the flexible arm 122 located between two adjacent wiring portions 12.

According to one embodiment of the present disclosure, the flexible arm 122 is disposed between two adjacent wiring portions 12, and the flexible arm 122 is formed in a shape having an opening 124. In such an arrangement, the pitch adjustment between wiring portions 12 can be easily implemented through deformation of the opening 124.

According to one embodiment of the present disclosure, the flexible arm 122 opens in a direction identical with or opposite to a direction in which the carrying portion 14 protrudes from the wiring portion 12. The opening direction of the opening 124 may realize free deployment of the carrying portion 14 at any position of the lighting strip.

According to one embodiment of the present disclosure, the flexible arm 122 is U-shaped or V-shaped. As shown in FIG. 1, the U shape or V shape opening direction of the U-shaped or V-shaped flexible arm 122 is opposite to the direction in which the carrying portion 14 protrudes from the wiring portion 12. According to one embodiment of the present disclosure, the U shape or V shape opening direction is identical with the direction in which the carrying portion 14 protrudes from the wiring portion 12. The flexible printed circuit of the present embodiment is simple in structure, easy to implement and convenient to install.

According to one embodiment of the present disclosure, the flexible arm 122 is configured such that its arm portion can be bent (or folded) in a horizontal or vertical surface to change the opening degree of the opening and thus to adjust the pitch between two adjacent carrying portions 14 and a light transmitting direction of the lighting elements 20 mounted on the carrying portions 14. Upon installation, positions of carrying portions 14 at both ends of the flexible arm 122 may be easily adjusted through the deformation of the flexible arm 122.

According to one embodiment of the present disclosure, the main body portion 120 is provided with a welding pad 126 for line connection and/or a contact 124 for an individual connector. In the case that the main body portion 120 and carrying portion 14 are made from the same material, power is supplied to an LED 20 by the welding pad 126 and/or contacts 124. In an embodiment, both the welding pad 126 and contacts 124 may be disposed on the main body portion 20 to increase selectivity for connecting to the circuit. In another embodiment, only one of the welding pad 126 and contact 124 may be selectively arranged.

According to one embodiment of the present disclosure, one of the wiring portions comprises one flexible arm. In another embodiment, one of the wiring portions comprises two flexible arms, for example, the flexible arm is disposed respectively on both sides of one of the wiring portions. The embodiment shown in FIG. 1 shows that the wring portions 12 at both ends of the flexible circuit strip 10 each have one flexible arm 122, and wiring portions 12 in an intermediate section of the flexible circuit strip 10 each have two flexible arms. However, it should be appreciated that this example is only for exemplary purpose, and the number of flexible arms may be selectively set according to needs. In another embodiment not shown, some wiring portions may not be provided with the flexible arm. The above-mentioned variations all fall within the scope of the present disclosure.

Figure 3:
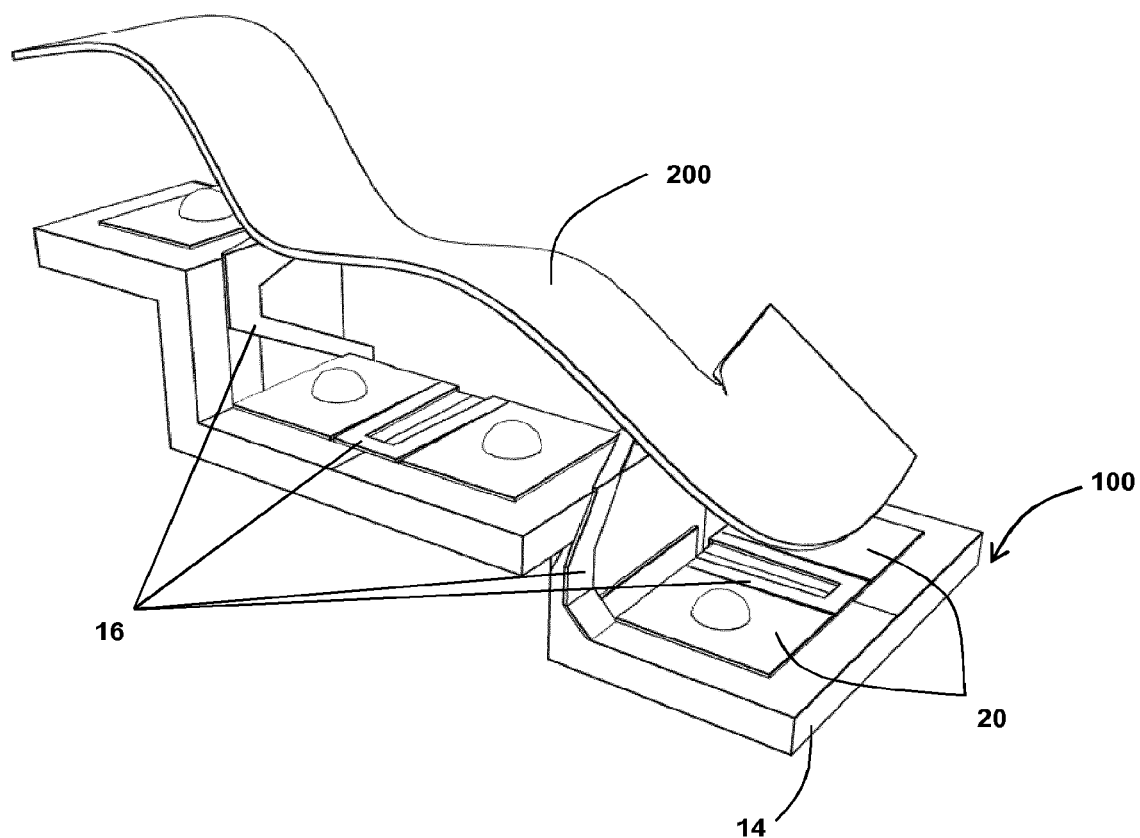
FIG. 3 shows an application instance of a lighting strip according to one embodiment of the present disclosure.

FIG. 3 shows an application instance of a lighting strip according to one embodiment of the present disclosure. The inventive concept of the present disclosure can be made apparent through the application instance of the lighting strip 10. It should be appreciated that for the sake of clarity illustration, only carrying portions of the lighting strip 10 are shown, a light guide member 200 is also illustrative, and only an incident surface of the light guide member 200 is shown.

As shown in the figure, the lighting device comprises a light guide member 200 and a lighting strip 100. The light guide member 200 has a light incident surface and a light exit surface. The carrying portion 14 of the lighting strip is arranged substantially opposite to the light incident surface so that light from the solid-state lighting element 20 mounted on the carrying portion 14 transmits through the light incident surface into the light guide member, and the pitch between two adjacent carrying portions 14 of the lighting strip 100 can be adjusted via the pitch adjusting portion 16. As shown in the figure, the position of the carrying portion 14 may be adjusted conveniently through flexible deployment of the pitch adjusting portion 16 (flexible arm). In this way, precise positioning of the lighting element 20 relative to the light guide member 200 can be realized.

According to one embodiment of the present disclosure, the lighting device is used as a lamp for vehicle. In another embodiment, the lighting device is used as a display panel of a display.

According to the lighting strip and lighting device of embodiments of the present disclosure, the positions of the solid-state lighting elements on the carrying portions, particularly the positions relative to the lighting elements, can be conveniently and precisely adjusted, thereby achieving a desired three-dimensional styling illumination.

Through the teachings provided in the above description and relevant figures, many modification forms and other embodiments of the present disclosure will be realized by those skilled in the art. Therefore, it should be understood that the embodiments of the present disclosure are not limited to the preferred embodiments as disclosed; moreover, the modified forms and other embodiments are intended to be included within the scope of the present disclosure. Besides, although the above description and relevant figures have described the exemplary embodiments under the background of some exemplary combinations of components and/or functions, it should be aware that different combination forms of the components and/or functions may be provided by alternative embodiments without departing from the scope of the present disclosure. In this case, for example, other combination forms of components and/or functions somewhat different from what have been explicitly described are also predicted to fall within the scope of the present disclosure. Although specific terms are employed here, they are only used in their general and descriptive meanings, not intended for limitation.

What is claimed is:

1. A device comprising:
 a plurality of wiring portions comprising at least one pitch adjusting portion between two adjacent wiring portions such that the at least one pitch adjusting portion comprises at least one flexible arm having an opening; and
 a plurality of carrying portions such that at least one carrying portion protrudes from a respective wiring portion.

2. The device of claim 1, wherein the at least one pitch adjusting portion adjusts a pitch between two adjacent carrying portions.

3. The device of claim 1, wherein the opening is V-shaped.

4. The device of claim 1, wherein the opening is U-shaped.

5. The device of claim 1, wherein the at least one flexible arm opens in a direction identical with a direction in which a carrying portion protrudes from a respective wiring portion.

6. The device of claim 1, wherein the at least one flexible arm opens in a direction opposite to a direction in which a carrying portion protrudes from a respective wiring portion.

7. The device of claim 1, wherein the at least one flexible arm is bendable or foldable in at least a horizontal position and a vertical position.

8. The device of claim 1 further comprising at least one light emitting element on at least one carrying portion.

9. The device of claim 8, wherein the at least one light emitting element is a light emitting diode (LED).

10. The device of claim 1, wherein at least one of the plurality of wiring portions is connected to an electrical power supply.

11. The device of claim 1, wherein the plurality of carrying portions protrude from a respective wiring portion in a rectangular tooth shaped pattern.

12. The device of claim 1, wherein the plurality of wiring portions and the plurality of carrying portions are made of a same material.

13. The device of claim 1, wherein the plurality of wiring portions and the plurality of carrying portions are made of a flexible polymer.

14. The device of claim 1, wherein the plurality of wiring portions and the plurality of carrying portions are made of a different material.

15. The device of claim 1, wherein the plurality of wiring portions are made of an electrically conductive material.

16. The device of claim 1, wherein at least one of the plurality of carrying portions is bent relative to its respective wiring portion.

17. A device comprising:
 a plurality of wiring portions comprising at least one pitch adjusting portion between two adjacent wiring portions; and
 a plurality of carrying portions such that at least one carrying portion protrudes from a respective wiring portion and is bent relative to its respective wiring portion.

* * * * *